(12) United States Patent
Shirai

(10) Patent No.: US 6,597,248 B2
(45) Date of Patent: Jul. 22, 2003

(54) VOLTAGE-CONTROLLED OSCILLATOR

(75) Inventor: Katsunori Shirai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/884,259

(22) Filed: Jun. 19, 2001

(65) Prior Publication Data

US 2002/0008594 A1 Jan. 24, 2002

(30) Foreign Application Priority Data

Jun. 19, 2000 (JP) ........................................ 2000-187522

(51) Int. Cl.[7] ................................................ H03B 5/12
(52) U.S. Cl. ............................. 331/117 R; 331/117 FE; 331/181; 331/36 L
(58) Field of Search ..................... 331/36 L, 117 D, 331/117 FE, 181, 117 R, 177 V

(56) References Cited

U.S. PATENT DOCUMENTS 6,121,850 A  *  9/2000  Ghoshal ............... 331/117 FE
6,249,190 B1 *  6/2001  Rozenblit et al. ....... 331/117 R

FOREIGN PATENT DOCUMENTS

JP        11-289220        10/1999

* cited by examiner

*Primary Examiner*—Robert Pascal
*Assistant Examiner*—Kimberly E Glenn
(74) *Attorney, Agent, or Firm*—Scully, Scott, Murphy & Presser

(57) ABSTRACT

A voltage-controlled oscillator in a phase-locked loop includes an LC oscillator. Control inductors are disposed of in the proximity of oscillator inductors, respectively. The control inductors are connected to a current source. By applying a control current to the control inductors, a mutual inductance is respectively induced between the oscillator inductors and the control inductors.

6 Claims, 8 Drawing Sheets

VOLTAGE-CONTROLLED OSCILLATOR

BACKGROUND OF THE INVENTION

The present invention relates to a voltage-controlled oscillator, and in particular, to a voltage-controlled oscillator capable of continuously controlling the frequency of oscillation by covering a wide range.

Description of the Prior Art

With the increase in the operation speed and capacity of communications apparatuses, it has been desired to increase a frequency and to lower jitters in a voltage-controlled oscillator which is arranged as a constituent element of a phase-locked loop (PLL). In the oscillator, it is regarded as quite important to employ an LC oscillator as an oscillation mechanism.

The LC oscillator includes inductors having a fixed or variable inductance. To adjust the oscillation frequency of the LC oscillator to a desired frequency in which inductors have a fixed inductance, variable capacitors are employed to appropriately adjust a capacitance so as to control the oscillation frequency. In such a case, control of the oscillation frequency is limited to a relatively narrower range adjustable by the variable capacitors. FIG. 1 shows a circuit configuration of a conventional oscillator.

FIG. 2 illustrates a conventional oscillator in which variable inductors capable of appropriately adjusting its inductance are used. The conventional oscillator includes variable capacitors as well as variable inductors which constitute an LC oscillator. Japanese Patent Laid-Open No. 11-289220 entitled "Broadband Voltage-Controlled Oscillator" describes an example of a prior art oscillator. In this example, variable inductors enable to set a discrete inductance, and a wide range of oscillator frequency is set up by adjusting a capacitance of the variable capacitors.

However, in the conventional Broadband Voltage-Controlled Oscillator as described in the above-mentioned gazette, an inductance of variable inductors is adjusted only in a discrete manner. To control the oscillator so that it covers a wide range of the oscillation frequency, it is essential to adjust a capacitance of the variable capacitors. That is, the variable inductors and capacitors are essential elements for the conventional oscillator. With these inductors and capacitors, the oscillation frequency of the voltage-controlled oscillator is widely controlled, which corresponds to a variety of requirements in the development of recent communications systems.

SUMMARY OF THE INVENTION

It is therefore an object of the present invention to provide a voltage-controlled oscillator in which variable inductors capable of controlling its inductance in a continuous manner are adopted in place of the prior art variable inductors with which an inductance is controlled in a discrete fashion. The present invention also aims to provide a voltage-controlled oscillator which eliminates a process of adjusting a capacitance of the variable capacitors when performing a wide-range control of the oscillation frequency.

Another object of the present invention is to provide a voltage-controlled oscillator which comprises variable capacitors so that an accurate control of the oscillation frequency is performed by adjusting a capacitance of the variable capacitors and an inductance of the variable inductors.

To achieve the above-mentioned object, there is provided a voltage-controlled oscillator, comprising an LC oscillator including oscillator inductors, and control inductors respectively arranged in the vicinity of the oscillator inductors, wherein a mutual inductance is induced between the oscillator inductors and control inductors by supplying a control current to the control inductors.

In accordance with the present invention, the voltage-controlled oscillator further comprises a current source to supply the control current to the control inductors, in which the current source adjusts the control current in accordance with a control signal supplied from an external device.

In accordance with the present invention, there is provided a voltage-controlled oscillator, comprising an LC oscillator including oscillator inductors, and a plurality of control inductors arranged in the vicinity of each of the oscillator inductors, wherein a mutual inductance is induced between the oscillator inductors and the control inductors by supplying a control current to the control inductors.

In the voltage-controlled oscillator according to the present invention, the plurality of control inductors are arranged with a different spacing with respect to said oscillator inductors. Furthermore, the plurality of control inductors have an inductance of different value.

BRIEF DESCRIPTION OF THE DRAWINGS

The objects and features of the present invention will become more apparent from the consideration of the following detailed description taken in conjunction with the accompanying drawings in which.

DESCRIPTION OF THE EMBODIMENTS

Referring now to the accompanying drawings, description will be given in detail of embodiments according to the present invention.

Figure 1:
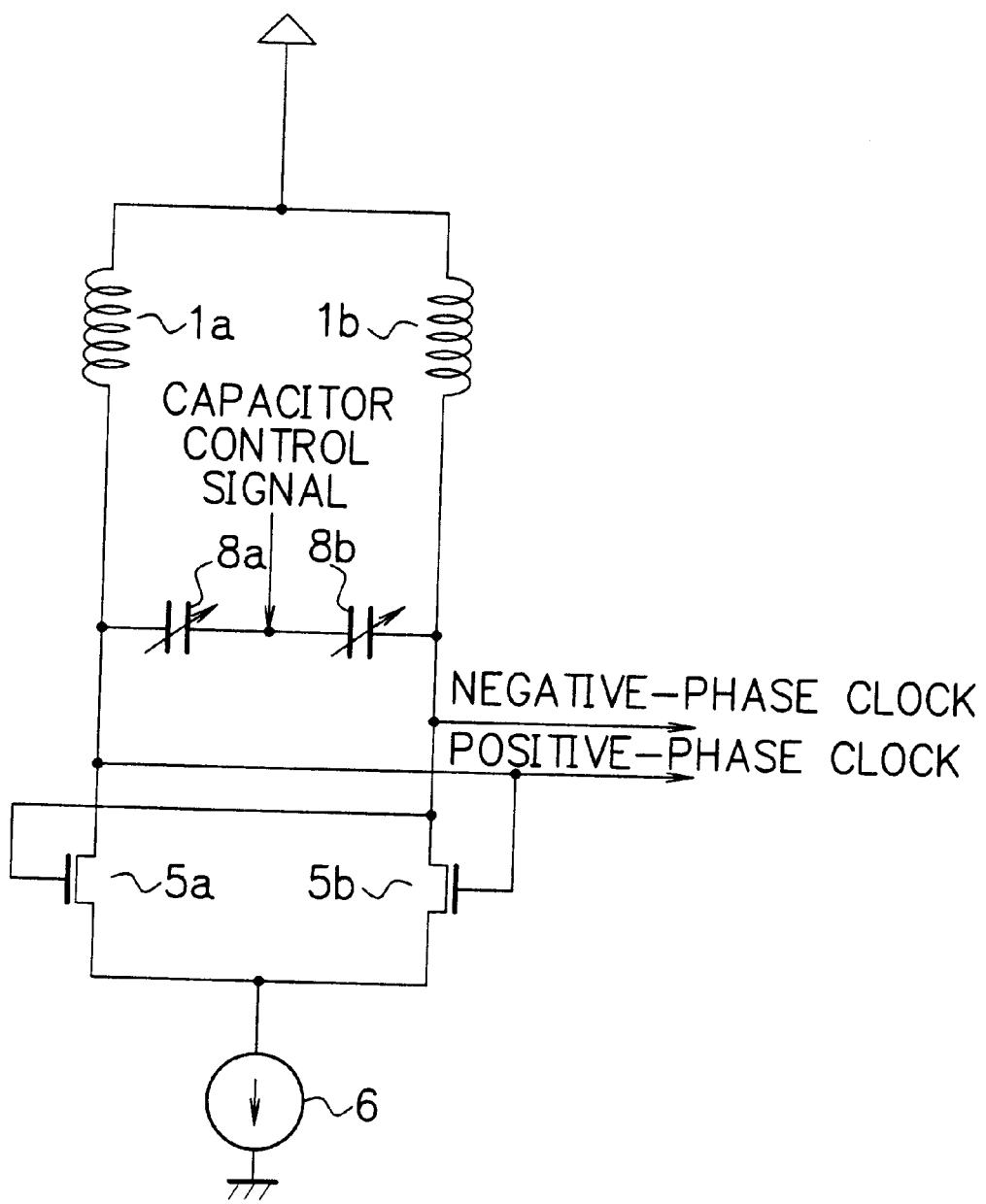
FIG. 1 is a schematic circuit diagram of a voltage-controlled oscillator according to the prior art.
Figure 2:
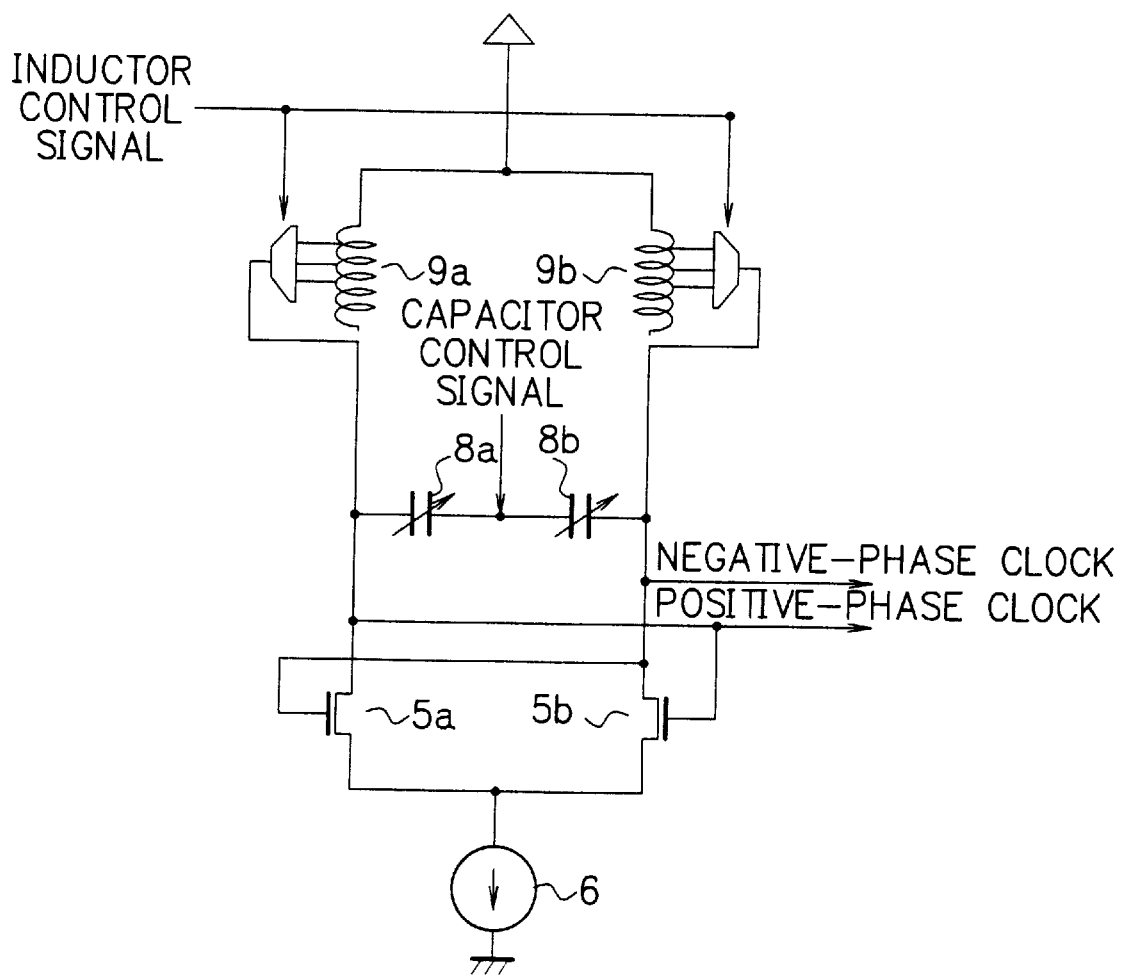
FIG. 2 is a circuit diagram schematically showing another example of a prior art voltage-controlled oscillator.
Figure 3:
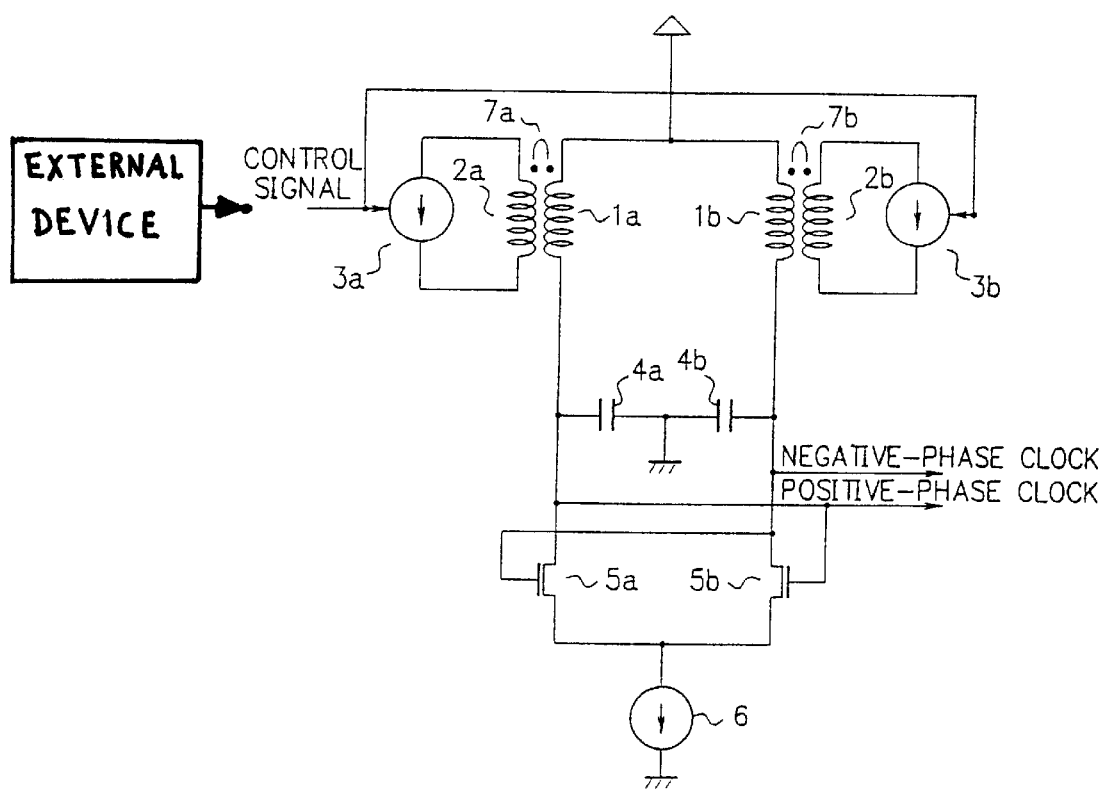
FIG. 3 is a circuit diagram showing constitution of a voltage-controlled oscillator according to an embodiment of the present invention.

FIG. 3 is a circuit configuration of a voltage-controlled oscillator according to an embodiment of the present invention. In an ordinary voltage-controlled oscillator, an LC oscillator includes oscillator inductors $1a$ and $1b$, and capacitors $8a$ and $8b$ as shown in FIG. 1. In contrast to the ordinary oscillator, a voltage-controlled oscillator of FIG. 3 according to the present embodiment includes an LC oscillator comprising, in addition to the oscillator inductors $1a$ and $1b$, and capacitors $4a$ and $4b$, control inductors $2a$ and 2b arranged in the neighborhood of the oscillator inductors 1a and 1b, respectively. The control inductors 2a and 2b are respectively connected to current sources 3a and 3b. When a control current flows through each of the control inductors 2a and 2b, a mutual inductance is induced between the oscillator inductor 1a and the control inductor 2a, and between the oscillator inductor 1b and the control inductor 2b, whereby the oscillation frequency of the voltage-controlled oscillator is controlled.

The current sources 3a and 3b which respectively supply a control current to the control inductors 2a and 2b, are controlled by a control circuit such as a circuit in a phase comparator of a phase-locked loop. The control circuit adjusts a control current to each of the control inductors 2a and 2b. The mutual inductance induced between the oscillator inductor 1a and the control inductor 2a, and between the oscillator inductor 1b and the control inductor 2b is therefore controlled by the control circuit. As a result, it is possible to externally control a combined inductance with respect to the oscillator inductors 1a and 1b, that is, the overall inductance of the LC oscillator.

The voltage-controlled oscillator according to the present embodiment includes the LC oscillator as mentioned above. With the LC oscillator alone, amplitude of a clock signal is attenuated. To compensate this attenuation, the voltage-controlled oscillator according to the present embodiment includes two transistors 5a and 5b. The transistors 5a and 5b are symmetrically arranged to produce clock signals, positive-phase (in-phase) signals and negative-phase (180° out of phase) signals. Source terminals of the transistors 5a and 5b are connected to a current source 6 to maintain oscillation of clock signals. It is noted that the transistors 5a and 5b, the current sources 3a, 3b, and 6 are well known to those skilled in the art, and are not directly associated with essential points of the present invention. Therefore, a constitution thereof will not be described in detail here.

Figure 4:
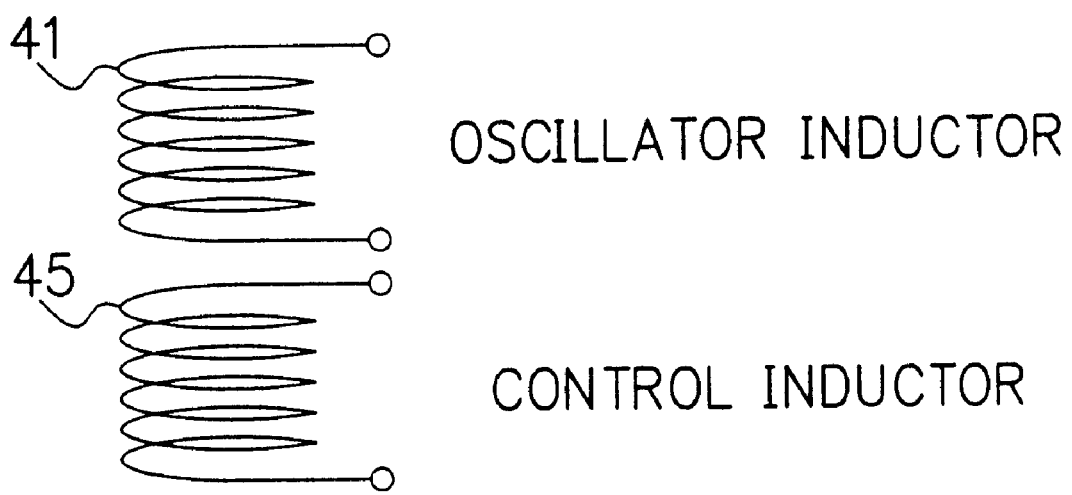
FIG. 4 shows a variable inductor by way of example according to the present invention.

FIG. 4 shows by way of example a variable inductor according to the present embodiment. In the figure, two associated inductors, i.e., a first inductor 41 and a second inductor 45, are neighboring with each other. The first inductor is an oscillator inductor and the second is a control inductor. Constant current flows through the oscillator inductor, therefore a mutual inductance induced between the oscillator and control inductors as shown in FIG. 3 with reference numerals 7a and 7b, is changed by controlling a current passing through the control inductor. The greater the current flowing through the control inductor, the greater the mutual inductance. The overall inductance, or a combined inductance with respect to the oscillator inductor is a sum of self-inductance and mutual inductance or a difference therebetween. In the oscillator, the mutual inductance acts as a variable component.

Figure 5:
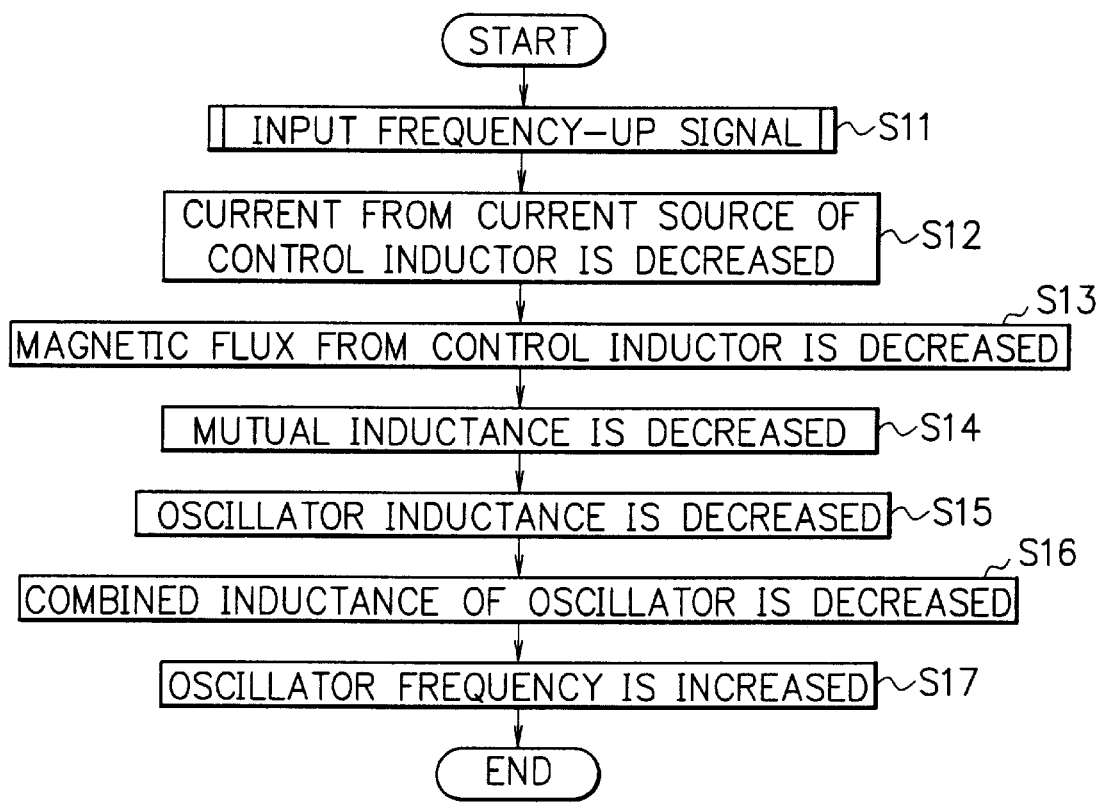
FIG. 5 is a flowchart for describing operation of a voltage-controlled oscillator according to an embodiment of the present invention.

Operation of a voltage-controlled oscillator according to the present embodiment will be described below. A flowchart of FIG. 5 shows in detail operation of the oscillator when the frequency of a clock signal generated by the LC oscillator increases. The relationship between a control current and a mutual inductance (7a, 7b) as shown in FIG. 3, varies according to the direction of flow of the control current and to the direction of winding (polarity) of the inductor. With respect to the mutual inductance (7a, 7b), the oscillator inductor and control inductor are defined to exhibit a positive coupling, that is, the inductors are in the same polarity. In this situation, the greater the control current supplied to the control inductor, the greater the mutual inductance (7a, 7b) induced between the oscillator and control inductors.

If a control signal associated with an increase in frequency (frequency-up signal) is fed to the current sources 3a and 3b from a phase comparator (not shown) or in response to a mode setup signal in step S11 of FIG. 5, the current sources 3a and 3b respectively act to decrease a current to be fed to the control inductors 2a and 2b (step S12). This resultantly reduces a magnetic flux to be generated in the control inductors 2a and 2b (step S13). Consequently, the mutual inductance 7a induced between the control inductor 2a and the oscillator inductor 1a, and the mutual inductance 7b between the control inductor 2b and the oscillator inductor 1b, are decreased (step S14). The mutual inductance 7a (7b) with respect to the oscillator inductor 1a (1b) is then reduced (step S15).

Since a constant current flows through each of the oscillator inductors 1a and 1b, the reduction in the mutual inductance 7a and 7b lowers a combined inductance associated with each of the oscillator inductors a and 1b (step S16). Assuming that a combined inductance obtained by combining a self-inductance of the oscillator inductor 1a and an induced mutual inductance 7a is L, and the capacitor 4a has a capacitance of C, the oscillation frequency is expressed as:

$$\frac{1}{2\pi\sqrt{LC}} \qquad (1)$$

The reduction in the mutual inductance therefore acts to increase the oscillation frequency of the LC oscillator (step S17). The same is true for an oscillator comprising the oscillator inductor 1b with the mutual inductance 7b, and the capacitor 4b.

Figure 6:
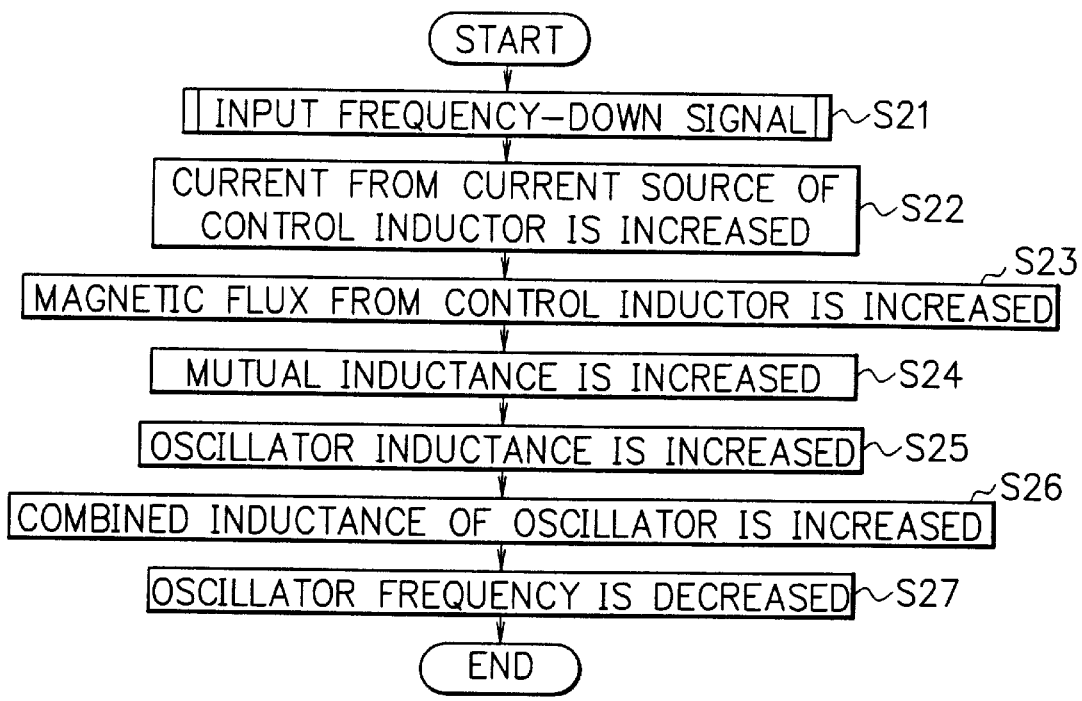
FIG. 6 is a flowchart for describing operation of a voltage-controlled oscillator according to another embodiment of the present invention.

Referring now to a flowchart of FIG. 6, description will be given in detail of a case where the frequency of a clock signal generated by the LC oscillator is decreased. If a control signal associated with a decrease in frequency (frequency-down signal) is fed to the current sources 3a and 3b from a phase comparator (not shown) or in response to a mode setup signal in step S21, the current sources 3a and 3b respectively increases a current to be fed to the control inductors 2a and 2b (step S22). Magnetic flux to be generated by the control inductors 2a and 2b is then increased (step S23). As a result, the mutual inductance 7a induced between the control inductor 2a and the oscillator inductor 1a, and the mutual inductance 7b between the control inductor 2b and the oscillator inductor 1b, are increased (step S24). The mutual inductance 7a (7b) with respect to the oscillator inductor 1a (1b) is then increased (step S25).

As mentioned above, a current of a fixed value flows through each of the oscillator inductors 1a and 1b. Therefore the increase in each mutual inductance (7a, 7b) lets a combined inductance associated with each of the oscillator inductors 1a and 1b increase in step S26. Accordingly, it is understood from the above Equation (1) that the oscillation frequency of the LC oscillator is decreased (step S27).

Figure 7:
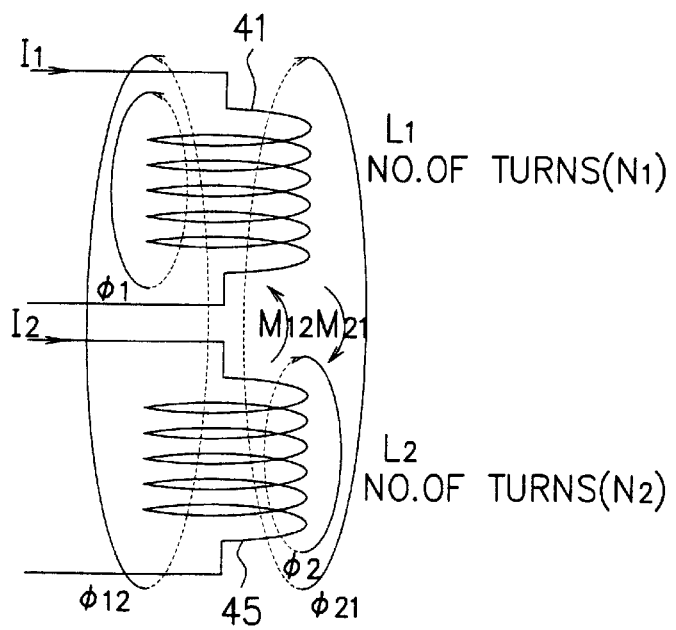
FIG. 7 is a diagram for showing operation of a variable inductance according to the present invention.

Referring to FIG. 7, description will be given in detail of operation associated with the variable inductance of the present embodiment. When a current $1_1$ is fed to an oscillator inductor 41, a magnetic flux $\phi_1$ is generated in the oscillator inductor 41, and at the same time a magnetic flux $\phi_{21}$ is generated through both the oscillator inductor 41 and a control inductor 45. Likewise, when a current $I_2$ is fed to the control inductor 45, a magnetic flux $\phi_2$ is generated in the control inductor 45, and a magnetic flux $\phi_{12}$ is generated through both the control inductor 45 and the oscillator inductor 41.

Assuming that the number of turns for the oscillator inductor 41 is $N_1$ and that for the control inductor 45 is $N_2$. The interlinkage flux $\phi_1$ associated with the oscillator inductor 41 is:

$$\phi_1 = N_1\phi_1 + N_2\phi_{12} \tag{2}$$

Therefore, when the oscillator inductor has a self-inductance $L_1$, and an associated mutual inductance is $M_{12}$, a combined inductance L including the mutual inductance of the oscillator is represented as follows.

$$\begin{aligned}
L &= \Phi_1/I_1 \\
&= N_1\phi_1/I_1 + N_2\phi_{12}/I_1 \\
&= N_1\phi_1/I_1 + (N_2\phi_{12}/I_2)(I_2/I_1) \\
&= L_1 + M_{12} \cdot I_2/I_1
\end{aligned} \tag{3}$$

It is understood from to the Equation (3) that, since the current $I_1$ flowing through the oscillator inductor 41 is constant in value, the combined inductance L is controlled by the current $I_2$ which flows through the control inductor 45.

According to the present embodiment, the control inductor is disposed of in the vicinity of the oscillator inductor, and a control current supplied to the control inductor is properly adjusted. With this configuration, a mutual inductance induced between these two inductors can be controlled, thus changing a combined inductance with respect to the oscillator inductor.

Figure 9:
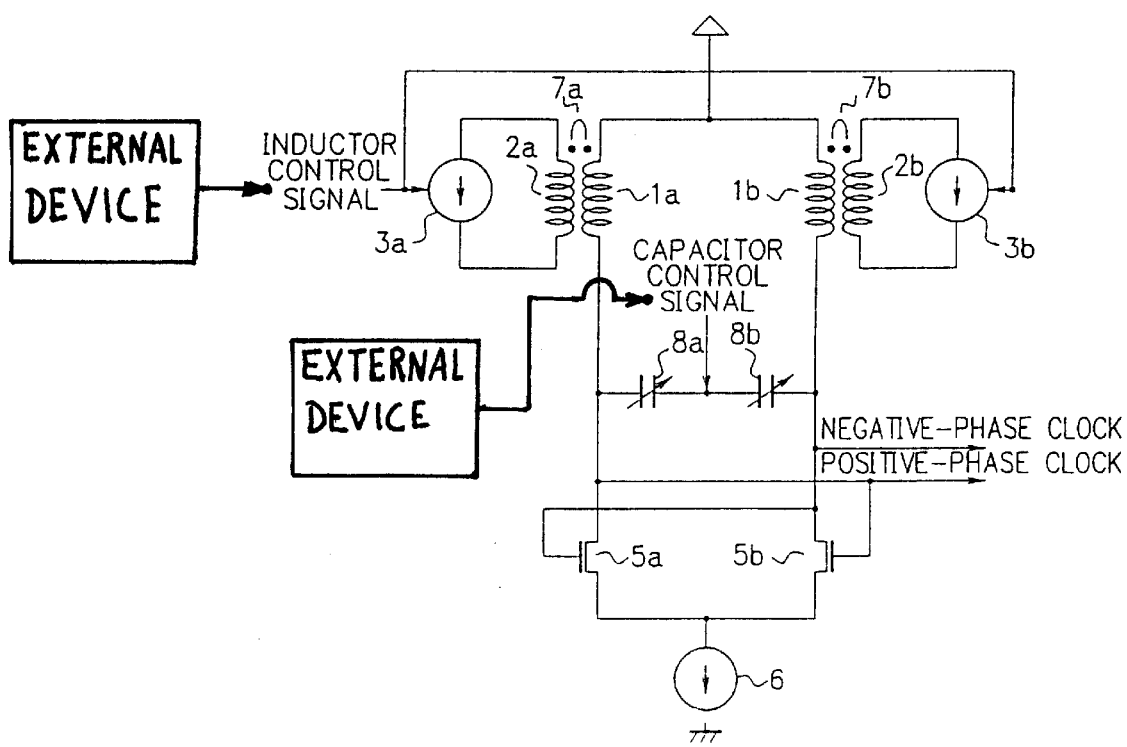
FIG. 9 is a circuit diagram of a voltage-controlled oscillator according to another embodiment of the present invention.

In another embodiment according to the present invention, there are employed variable capacitors 8a and 8b as shown in FIG. 9. The capacitors 8a and 8b are sequentially controlled by an external control signal (capacitor control signal). This control using the variable capacitors 8a and 8b, together with a control with the use of variable inductors, enables the control of the oscillation frequency to become more precise.

Assuming a case where a mutual inductance induced between a control inductor and an oscillator inductor becomes large as a current that is continuously supplied to the control inductor becomes large. In this situation, a combined inductance associated with the oscillator inductor becomes great compared with a case where a self-inductance is solely acting. Therefore, the oscillator has a high Q (called quality factor and expressed as $\omega L/R$), which improves the characteristic of the oscillator inductor.

Description will now be given of still another embodiment according to the present invention. A voltage-controlled oscillator according to this embodiment has basically a similar structure as that of the voltage-controlled oscillator according to the aforementioned embodiment. However, the oscillator according to this embodiment has been designed to have a good selectivity for the clock frequency of an LC oscillator.

Figure 8:
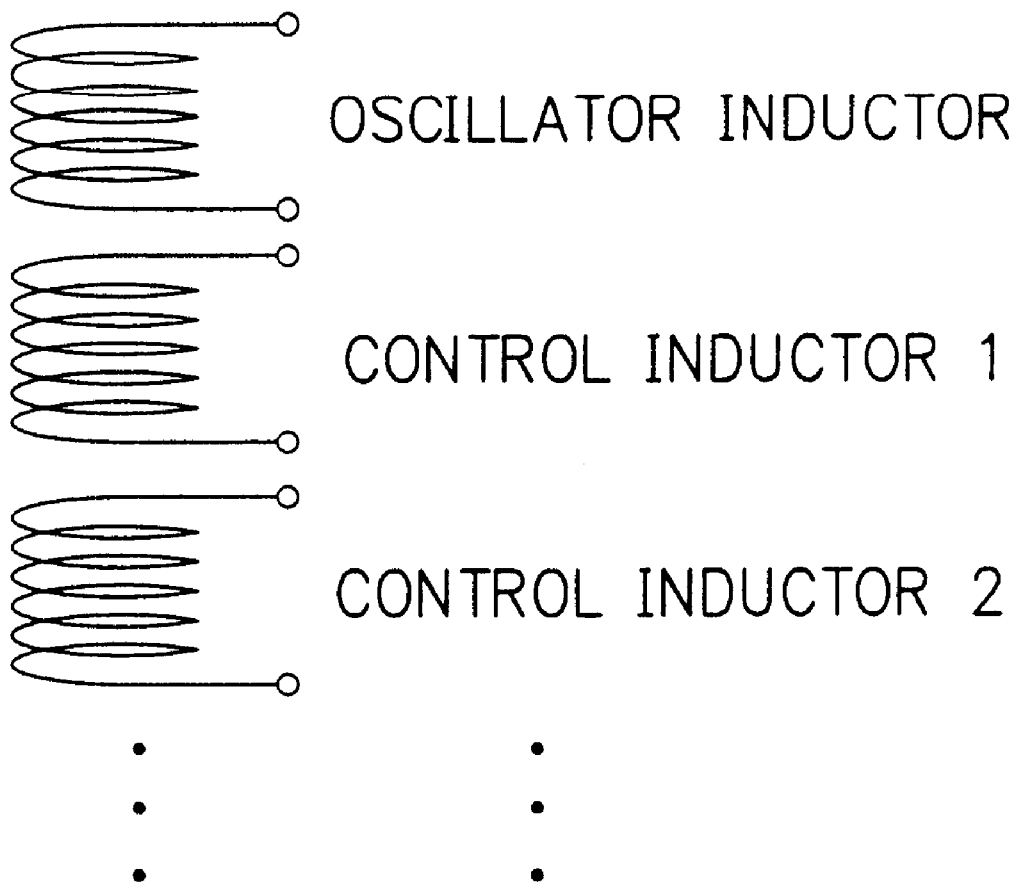
FIG. 8 is a variable inductance of another type according to the present invention.

For that purpose, in the oscillator:
(1) Two or more control inductors are disposed of with respect to one oscillator inductor as shown in FIG. 8.
(2) Distance or spacing between each control inductor and the oscillator inductor is variable.
(3) Each control inductor has a different inductance in value.

With the use of such control inductors, a coupling coefficient changes according to a magnetic flux generated by each control inductor, therefore combined inductances different in value can be obtained with respect to an oscillator inductor.

Furthermore, by varying the contents as described in items (1) to (3) or by combining thereof in various ways, combined inductances different in value can be also obtained. This enlarges a setup range with respect to the oscillation frequency, and realizes a precise frequency setup. It is noted that the variable capacitors 8a and 8b shown in FIG. 9 can be replaced by varactors.

According to the present invention, the voltage-controlled oscillator of a phase-locked loop includes an LC oscillator in which control inductors as an additional inductor are disposed of in the proximity of oscillator inductors. By applying a control current to the control inductors which are connected to a current source, a mutual inductance is induced between the oscillator and control inductors.

As a result, the oscillator inductors have a combined inductance with a self-inductance and the mutual inductance combined. The self-inductance is an inductance related to a constant current flowing through the oscillator inductor, and takes a fixed value. The mutual inductance consisting partly of the combined inductance is a variable component. Change in the mutual inductance therefore controls the oscillation frequency of the voltage-controlled oscillator.

More specifically, the voltage-controlled oscillator according to the present invention adopts variable inductors capable of controlling inductance in a continuous manner in place of those conventional inductors which control an inductance in a discrete fashion. This eliminates a capacitance control processing using variable capacitors when performing a wide-range control of the oscillation frequency.

Furthermore, according to the present invention, by executing a capacitance control using variable capacitors as well as a control over inductance of the variable inductors, the oscillation frequency can be more precisely controlled.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A voltage-controlled oscillator, comprising:
   an LC oscillator including oscillator inductors; and
   a plurality of control inductors arranged in the vicinity of each of said oscillator inductors,
   wherein a mutual inductance is induced between said oscillator inductors and said control inductors by supplying a control current to said control inductors.

2. A voltage-controlled oscillator according to claim 1, wherein said plurality of control inductors are arranged with a different spacing with respect to said oscillator inductors.

3. A voltage-controlled oscillator according to claim 2, wherein said plurality of control inductors have an inductance of different value.

4. A voltage-controlled oscillator according to claim 3, further comprising variable capacitors whose capacitance is capable of being set to an arbitrary value in response to a control signal supplied from an external device.

5. A voltage-controlled oscillator according to claim 1, further comprising a current source to supply said control current to said control inductors, said current source adjusting said control current in accordance with an inductor control signal supplied from an external device.

6. A voltage-controlled oscillator according to claim 5, further comprising variable capacitors whose capacitance is capable of being set to an arbitrary value in response to a capacitor control signal supplied from an external device.

* * * * *